US 9,823,578 B2

(12) United States Patent
    Rist

(10) Patent No.: US 9,823,578 B2
(45) Date of Patent: Nov. 21, 2017

(54) CONTROL DEVICE FOR CONTROLLING AT LEAST ONE MANIPULATOR OF A PROJECTION LENS

(71) Applicant: Carl Zeiss SMT GmbH, Oberkochen (DE)

(72) Inventor: Stefan Rist, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 11 days.

(21) Appl. No.: 15/081,074

(22) Filed: Mar. 25, 2016

(65) Prior Publication Data
    US 2016/0299436 A1     Oct. 13, 2016

(30) Foreign Application Priority Data
    Apr. 10, 2015   (DE) .................. 10 2015 206 448

(51) Int. Cl.
    G03F 7/20      (2006.01)
    G02B 7/02      (2006.01)
    G02B 27/00     (2006.01)
(52) U.S. Cl.
    CPC ......... G03F 7/70258 (2013.01); G02B 7/023 (2013.01); G02B 27/0012 (2013.01);
    (Continued)
(58) Field of Classification Search
    CPC ............ G02B 27/0012; G02B 27/0068; G02B 7/023; G03F 7/70141; G03F 7/70266;
    (Continued)

(56) References Cited

U.S. PATENT DOCUMENTS 6,493,374 B1    12/2002  Fomenkov et al.
2003/0063268 A1  4/2003  Kneer et al.
                         (Continued)

FOREIGN PATENT DOCUMENTS

DE    10 2008 042 356 A1    4/2010
DE    10 2012 205 096 B3    8/2013
                  (Continued)

OTHER PUBLICATIONS

H. Gross, "Handbook of Optical Systems", vol. 2, 2005, p. 215.
                  (Continued)

*Primary Examiner* — Michelle M Iacoletti
(74) *Attorney, Agent, or Firm* — Fish & Richardson P.C.

(57) ABSTRACT

The disclosure provides a control device for controlling at least one manipulator of a microlithographic projection lens by generating a travel command, which defines a change to be undertaken, of an optical effect of at least one optical element of the projection lens by manipulating a property of the optical element via the at least one manipulator along a travel. The control device is configured to generate the travel command for the at least one manipulator from a state characterization of the projection lens by optimizing a merit function. Here, the merit function includes a linear combination of at least two exponential expressions, a setting of the at least one manipulator defining the manipulation of the property of the optical element is represented via a travel variable and the respective base of the at least two exponential expressions contains a function of the travel variable.

20 Claims, 3 Drawing Sheets

(52) U.S. Cl.
CPC ......... *G02B 27/0068* (2013.01); *G03F 7/705* (2013.01); *G03F 7/70141* (2013.01); *G03F 7/70266* (2013.01); *G03F 7/70425* (2013.01); *G03F 7/70433* (2013.01)

(58) Field of Classification Search
CPC .. G03F 7/705; G03F 7/70425; G03F 7/70433; G03F 7/70258
See application file for complete search history.

(56) References Cited

U.S. PATENT DOCUMENTS

| | | |
|---|---|---|
| 2006/0119822 A1 | 6/2006 | Fehr et al. |
| 2008/0170212 A1 | 7/2008 | De Winter et al. |
| 2009/0207487 A1 | 8/2009 | Feldmann et al. |
| 2011/0205510 A1 | 8/2011 | Menchtchikov et al. |
| 2012/0188524 A1 | 7/2012 | Bittner et al. |
| 2013/0188246 A1 | 7/2013 | Rogalsky et al. |
| 2013/0258302 A1 | 10/2013 | Bittner et al. |
| 2014/0176924 A1 | 6/2014 | Bittner et al. |

FOREIGN PATENT DOCUMENTS

| | | |
|---|---|---|
| DE | 10 2013 225 381 A1 | 11/2014 |
| JP | 2009-037251 | 2/2009 |
| JP | 2010-511194 | 4/2010 |
| JP | 2012-212884 | 11/2012 |
| JP | 2013-229602 | 11/2013 |
| WO | WO 2010/034674 A1 | 4/2010 |
| WO | WO 2014/000763 | 1/2014 |

OTHER PUBLICATIONS

Daniel Malacara, "Optical Shop Testing"; 2nd Edition (1992), John Wiley & Sons, Inc. Chapters 13.2.2-13.2.3.

European Search Report and Opinion, and the English translation thereof for corresponding EP Appln. No. 16 000 776.1, dated Oct. 27, 2016, 9 pages.

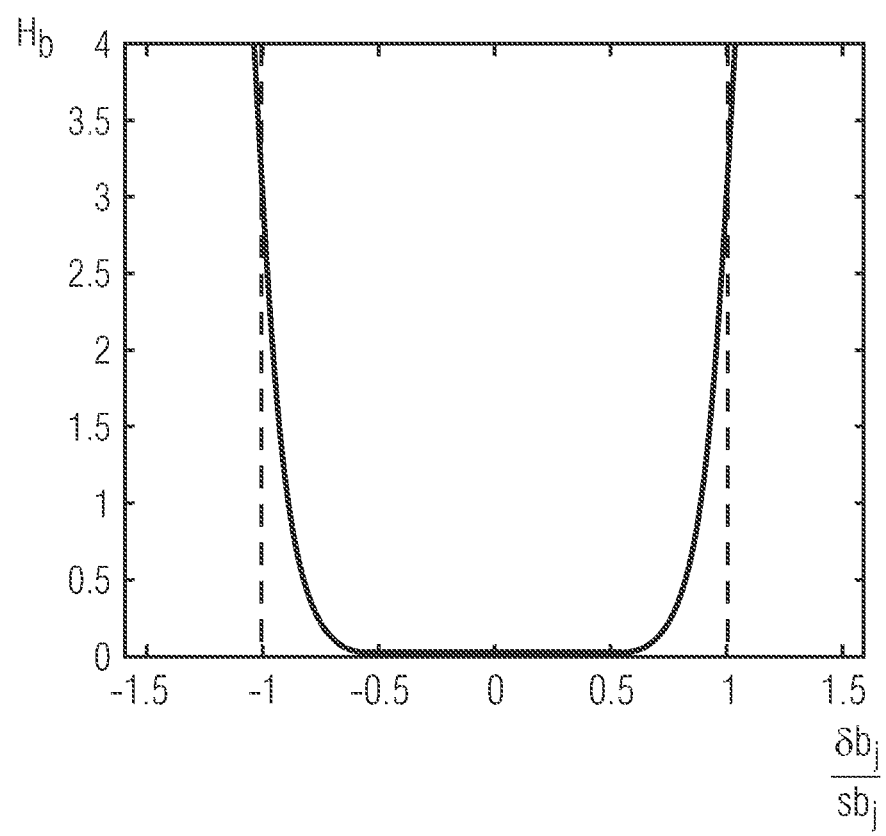

CONTROL DEVICE FOR CONTROLLING AT LEAST ONE MANIPULATOR OF A PROJECTION LENS

CROSS-REFERENCE TO RELATED APPLICATIONS

This application claims priority under 35 U.S.C. §119(e) to German Application No. 10 2015 206 448.4, filed Apr. 10, 2015. The contents of this application is hereby incorporated by reference in its entirety.

FIELD

The disclosure relates to a control device and the method for controlling at least one manipulator of a microlithographic projection lens. Furthermore, the disclosure relates to an adjustment apparatus for adjusting a microlithographic projection lens and a microlithographic projection exposure apparatus, each with such a control device.

BACKGROUND

A microlithographic projection exposure apparatus serves for the generation of structures on a substrate in the form of a semiconductor wafer during the production of semiconductor components. To this end, the projection exposure apparatus includes a projection lens having a plurality of optical elements, for imaging mask structures on the wafer during the exposure process.

A projection lens with wavefront aberrations that are as small as possible is desirable to image the mask structures on the wafer as precisely as possible. Therefore, projection lenses are equipped with manipulators, which render it possible to correct wavefront errors by changing the state of individual optical elements of the projection lens. Examples for such a state change include: a change in position in one or more of the six rigid body degrees of freedom of the relevant optical element, an impingement of the optical element with heat and/or coldness, a deformation of the optical element or a material ablation at the optical element via a post-processing device. Within the scope of this application, such a post-processing device is also understood as a manipulator of the projection lens in the general sense thereof.

Changes of the manipulator to be carried out in order to correct an aberration characteristic of a projection lens are calculated via a travel-generating optimization algorithm, which is also referred to as "manipulator change model". By way of example, such optimization algorithms are described in WO 2010/034674 A1.

Thus, optimization algorithms known from the prior art may be configured to solve the following optimization problem:

$$\min \|Mx - b_{mess}\|_2^2 \text{ with } NB: F_i(x) \leq \text{spec}_x^i$$

Such an optimization problem is configured to minimize the merit function, also referred to as figure-of-merit function, described by $\|Mx - b_{mess}\|_2^2$, taking into account constraints described by $F_i(x) \leq \text{spec}_x^i$. Here, M denotes a sensitivity matrix, x denotes a travel vector with travels for the individual manipulators, $b_{mess}$ denotes a state vector of the projection lens which describes a measured aberration characteristic of the projection lens, $\| \|_2$ denotes the Euclidean norm and $\text{spec}_x^i$ denotes a respective fixed limit for individual travels $x_i$.

Here, a "travel" is understood to mean a change in the state variable of an optical element, carried out via manipulator actuation, along the travel for the purposes of changing the optical effect thereof. Such a travel defined by changes in the state variable of the optical element is specified by way of target change variables of the associated manipulator. By way of example, the manipulation can consist of the displacement of the optical element in a specific direction, but it can also consist of e.g. an impingement, in particular a local or two-dimensional impingement, of the optical element with heat, coldness, forces, light with a specific wavelength or currents. Furthermore, the manipulation can define material ablation at an optical element, which is to be carried out via a post-processing device. By way of example, the target change variable can define a path length to be covered or an angular range to be covered in the case of a displacement.

The constraints defined by $F_i(x) \leq \text{spec}_x^i$ provide hard displacement limits for the manipulators, which may not be exceeded. The optimization result in the form of a travel command generated thereby is not ideal for all manipulator configurations.

SUMMARY

The disclosure seeks to provide a control device and a method of the type set forth at the outset, by which the aforementioned problems are solved and, in particular, the quality of a travel command generated thereby can be improved.

By way of example, the disclosure provides a control device for controlling at least one manipulator of a microlithographic projection lens. The at least one manipulator is controlled by generating a travel command, which defines a change, to be undertaken, of an optical effect of at least one optical element of the projection lens by manipulating a property of the optical element via the at least one manipulator along a travel. The control device is configured to generate the travel command for the at least one manipulator from a state characterization of the projection lens by optimizing a merit function. Here, the merit function includes a linear combination of at least two exponential expressions. A setting of the at least one manipulator defining the manipulation of the property of the optical element is represented via a travel variable and the respective base of the at least two exponential expressions contains a function of the travel variable. Furthermore, the exponents of the at least two exponential expressions have different values. The term "exponential expression" in the context of this document refers to an expression obtained by exponentiation, i.e. an exponential expression is defined by the expression $b^n$, wherein b is the base and n is the exponent. An example of such exponential expressions is provided, for example, at page 18, lines 7-12 of the application.

The aforementioned projection lens includes a plurality of optical elements and, during the operation of a projection exposure apparatus including the projection lens, it serves to image mask structures from a mask plane onto a wafer arranged in a wafer plane of the projection exposure apparatus. The control device can also be referred to as a travel establishing device.

The travel variable can be available as a scalar variable for representing only one manipulator setting or as vector variable for representing the settings of the plurality of manipulators. The travel command includes at least one travel to be carried out by the at least one manipulator. Here, the travel is carried out by manipulating a property of the optical element along the travel. The merit function, which may also be referred to as "figure-of-merit function", includes a linear combination, in particular a sum, of at least two exponential expressions. In other words, the merit function includes at least two summands, which may be weighted during the summing where desired and which are each formed by an exponential expression. In accordance with the definition generally valid in mathematics, each one of the exponential expressions has a base and an exponent.

The respective base of the two summands contains a function of the travel variable. The values of the exponents of the at least two exponential expressions differ from one another. By assigning different values to the exponents, the merit function can be designed in such a way that target values for at least two different variables relevant during the optimization are provided with different resistance properties which are selected in a targeted manner. By way of example, such variables can include displacement limits of manipulators, material ablation at optical elements of the projection lens carried out via mechanical post-processing, image aberrations of the projection lens, fading aberrations of the projection lens or overlay errors of the projection lens. A resistance property of a target value is understood to mean how exactly the target value is to be maintained during the optimization.

A target value which represents a limit that is observed or a limit from which there may only be minimal deviations in this case has a maximum resistance property and it is referred to as a "hard" target value in this context. A target value which ideally should be observed, but from which deviations are, however, tolerated if, in return, other properties of the optimization, in particular other target values, can be satisfied better, is referred to as a "soft" target value in this context.

The different exponential expressions of the merit function can define merit function components or partial merit functions which in each case relate a different one of the aforementioned, different variables relevant during the optimization to associated target values. As a result of the provision according to the disclosure of different values for the exponents of the at least two exponential expressions of the merit function, it is possible to provide the target values of the different variables with different resistance properties and therefore control the significance of the variables in the optimization in a targeted manner. In particular, a different weighting can be applied to the various variables. In other words, it is possible to make a targeted distinction between more important and less important variables in the optimization. Hence, the quality of the optimization results and therefore the usability of the generated travel command are improved.

In accordance with one embodiment, the control device is embodied to control the at least one manipulator of a projection lens configured for operation in the EUV wavelength.

In accordance with a further embodiment according to the disclosure, the at least two exponential expressions have different bases. As a result, resistant properties of the variables relevant during the optimization can be set in an even finer and more targeted manner by the targeted adaptation of the bases. The targeted adaptation of the bases can be carried out, for example, by a suitable selection of weighting parameters of the target values assigned to the variables. In accordance with an alternative embodiment, the at least two exponential expressions with different exponents have the same basis. By way of example, this can take place within the scope of configuring the merit function as a Taylor series expansion.

In accordance with a further embodiment, the exponents of the at least two exponential expressions have values each greater than or equal to two. Hence, the exponents of the at least two exponential expressions have different values, each greater than or equal to two. In accordance with one embodiment variant, the exponents of the at least two exponential expressions have values of in each case greater than or equal to three, in particular of greater than or equal to four or greater than or equal to five. As a result of the appropriate selection of the values of the exponential expressions, there is a certain minimum for the steepness of the component of the merit function which can be traced back to the respective exponential expression and therefore there is an improved observation of target values, which are assigned to the relevant variables during the optimization.

In accordance with a further embodiment, the respective base of the at least two exponential expressions contains a quotient in each case, the numerator of which includes a term containing the function of the travel variable and the denominator of which has a target value for the term of the numerator and a weighting factor for the target value. In accordance with one embodiment variant, the weighting factor has a value of at least 0.5; in particular, the value lies between 0.5 and 2.0. In accordance with one embodiment, the weighting factor of the base of the first exponential expression lies in the range from 0.5 to 2.0 and the weighting factor of the base of the second exponential expression lies in the range from 0.6 to 0.95. According to this embodiment, the first exponential expression forms at least one component of a partial merit function with a "soft" target value while the second exponential expression forms at least one component of a partial merit function with a "hard" target value. Therefore, the overall merit function weights at least two target values differently in a corresponding manner.

In accordance with a further embodiment, the merit function has at least one component which is a convex or concave function of the travel variable. In particular, the whole merit function is a convex or concave function of the travel variable.

In accordance with a further embodiment, a difference in the values of the two exponents is at least 5, in particular at least 10. In accordance with one embodiment variant, the exponent of the first exponential expression has a value of at least 20, in particular a value greater than 36. In accordance with one exemplary embodiment, the exponent of the first exponential expression has a value in the range from 20 to 60 and the exponent of the second exponential expression has a value in the range from 6 to 10. Therefore, the first exponential expression forms at least one component of the partial merit function with a "hard" target value while the second exponential expression forms at least one component of a partial merit function with a "soft" target value. Therefore, the overall merit function weights at least two target values differently in a corresponding manner.

In accordance with a further embodiment, the control device is configured to control a plurality of manipulators, the state characterization includes a plurality of state parameters characterized by a state vector, and each of the exponential expressions includes a sensitivity matrix which defines a relationship between the travels of the manipulators and the state vector. In other words, the sensitivity matrix describes the sensitivity of the manipulators in relation to the degrees of freedom of movement thereof. In respect of the manipulator $M_s$, the sensitivity matrix defines how the state vector of the projection lens changes when the manipulator $M_s$ is adjusted by one standard travel.

In accordance with a further embodiment, one of the exponential expressions includes a term which describes an image aberration of the projection lens. In particular, the image aberration is described via Zernike coefficients in this case.

In accordance with a further embodiment, one of the exponential expressions includes a term which describes a fading aberration of a microlithographic step- and scan projection exposure apparatus. In the step and scan projection exposure apparatus, a mask and a wafer move relative to one another when imaging the mask on the wafer. A fading aberration is understood to mean a specification as to how an image aberration changes in the scanning direction, i.e. in the direction of the relative movement between the mask and the wafer during the exposure.

In accordance with a further embodiment, one of the exponential expressions includes a term which describes a root mean square of a selection of image aberrations of the projection lens. The root mean square value is also referred to as "RMS value". In accordance with one embodiment, the exponent of the exponential expression describing the root mean square of a selection of image aberrations has a value of at least 10; in particular, the value falls in the range between 10 and 30. Therefore, this exponential expression forms at least one component of a partial merit function with a "hard" target value. The selection of image aberrations for the root mean square value for example includes all Zernike coefficients Zj with j≤100, in particular with j≤64, j≤49, j≤25 or j≤10. The definition of the Zernike coefficients Zj is explained below.

In accordance with a further embodiment, one of the exponential expressions includes a term which describes a pure overlay error. An overlay error specifies a local image position displacement of an imaged mask structure in relation to the setpoint position thereof on the substrate.

In accordance with a further embodiment, one of the exponential expressions includes a term which describes an error correctable via mechanical post-processing of an optical element of the projection lens. By way of example, such errors are corrected with so-called intrinsically corrected aspheres (ICAs). These errors are reduced or eliminated by a subsequent mechanical treatment of an asphere serving as an optical element.

In accordance with a further embodiment, the merit function contains at least one implicit constraint for the travel. Such an implicit constraint is described within the scope of the merit function, as is the case, for example, in the merit function of a Tikhonov regularization described on page 45 of WO2010/034674A1 under (a'). In contrast thereto, explicit constraints outside of the merit function are described.

Furthermore, an adjustment apparatus for adjusting a microlithographic projection lens is provided according to the disclosure. The adjustment apparatus includes a measurement system for establishing the state characterization of the projection lens and a control device in one of the embodiments described above for generating the travel command from the state characterization.

In accordance with one embodiment of the adjustment apparatus, the measurement system is configured as a wavefront measurement device. In particular, a wavefront measurement device can be configured as an interferometer, such as a Fizeau interferometer, or as a Shack-Hartmann sensor.

Furthermore, a microlithographic projection exposure apparatus is provided according to the disclosure. The projection exposure apparatus includes a projection lens for imaging mask structures, at least one manipulator, which is configured to change an optical effect of at least one optical element of the projection lens by manipulating a property of the optical element along a travel, and a control device in one of the embodiments described above for controlling the at least one manipulator.

In accordance with one embodiment, the control device included by the projection exposure apparatus can include a simulation device, which is configured to simulate changes in the optical properties of the at least one optical element which occur due to the heating of the optical element and to determine the state characterization on the basis of the simulation result. In accordance with a further embodiment, the projection exposure apparatus is configured for operation in the EUV wavelength range.

Furthermore, a method for controlling at least one manipulator of a microlithographic projection lens is provided according to the disclosure. The method includes generating a travel command for the at least one manipulator by carrying out an optimization of a merit function. Here, the merit function includes a linear combination of at least two exponential expressions. A setting of the at least one manipulator defining the manipulation of the property of the optical element is represented via a travel variable and the respective base of the at least two exponential expressions contains a function of the travel variable. Furthermore, the exponents of the at least two exponential expressions have different values. Furthermore, the method includes the step of changing an optical effect of at least one optical element of the projection lens by manipulating a property of the optical element via the at least one manipulator along a travel defined by the generated travel command.

In accordance with one embodiment, the travel command is generated via the control device in one of the embodiments described above.

The features specified in respect of the embodiments, exemplary embodiments and embodiment variants etc. of the control device according to the disclosure, listed above, can be accordingly transferred to the method according to the disclosure. Conversely, the features specified in respect of the embodiments, exemplary embodiments and embodiment variants of the method according to the disclosure, listed above, can be accordingly transferred to the control device according to the disclosure. These and other features of the embodiments according to the disclosure are explained in the description of the figures and in the claims. The individual features can be implemented, either separately or in combination, as embodiments of the disclosure. Furthermore, they can describe advantageous embodiments which are independently protectable and protection for which is claimed if appropriate only during or after pendency of the application.

BRIEF DESCRIPTION OF THE DRAWINGS

The above and further advantageous features of the disclosure are illustrated in the following detailed description of exemplary embodiments according to the disclosure with reference to the accompanying schematic drawings.

FIG. 3 shows a diagram visualizing the profile of a merit function component which is part of a merit function of an optimization algorithm running in the control device.

DETAILED DESCRIPTION OF EXEMPLARY EMBODIMENTS

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

Figure 1:
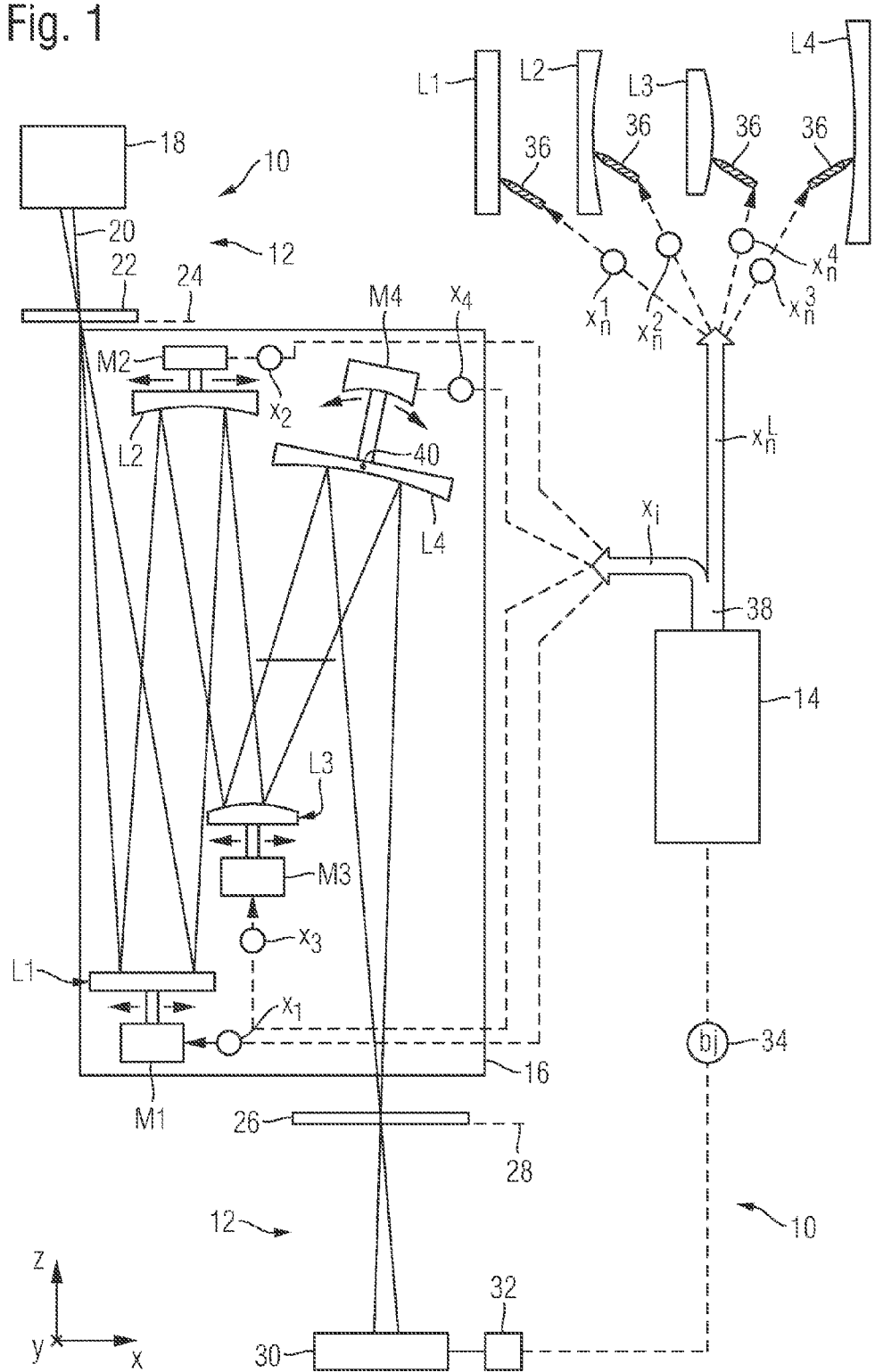
FIG. 1 shows a visualization of an embodiment of a control device according to the disclosure, for controlling manipulators of a microlithographic projection lens and a post-processing device.

In order to facilitate the description, a Cartesian xyz-coordinate system is indicated in the drawing, from which system the respective positional relationship of the components illustrated in the figures is evident. In FIG. 1, the y-direction runs perpendicular and into the drawing plane, the x-direction toward the right, and the z-direction upwardly.

FIG. 1 shows an adjustment apparatus 10 for adjusting a projection lens 16 of a microlithographic projection exposure apparatus. The adjustment apparatus 10 includes a measurement system 12 for establishing a state characterization 34 of the projection lens 16 and a control device 14 in the form of a so-called travel establishing device for generating a travel command 38 from the state characterization 34.

The projection lens 16 serves to image mask structures from an object plane 24 into an image plane 28 and it can be designed for exposure radiation at different wavelengths, such as e.g. 248 nm or 193 nm. In the present exemplary embodiment, the projection lens 16 is designed for a wavelength in the EUV wavelength range, e.g. 13.5 nm.

The measurement system 12 is configured to measure wavefront errors of the projection lens 16 and it includes an illumination device 18 and a measurement mask 22 on the entrance side of the projection lens 16 and a sensor element 26, a detector 30 and an evaluation device 32 on the exit side of the projection lens. The illumination device 18 is configured to generate measurement radiation 20 at the operating wavelength of the projection lens 16 to be tested, in the present case in the form of EUV radiation, and to radiate the radiation onto the measurement mask 22, which is arranged in the object plane 24. Within the scope of this application, EUV radiation should be understood to mean electromagnetic radiation with a wavelength of less than 100 nm, in particular a wavelength of approximately 13.5 nm or approximately 6.7 nm. The measurement mask 22, which is often also referred to as a "coherence mask", has a first periodic structure. The sensor element 26 in the form of an image grating, which has a second periodic structure, is arranged in the image plane 28. It is also possible to combine chequerboard structures on the measurement mask 22 with chequerboard structures in the sensor element 26. It is also possible to use other combinations of periodic structures known to a person skilled in the art from the field of shearing interferometry or point diffraction interferometry.

A detector 30 in the form of a camera, which resolves in two dimensions, is arranged below the sensor element 26, to be precise in the plane conjugate to the pupil plane of the projection lens 16. Together, the sensor element 26 and the detector 30 form a sensor module. The measurement mask 22 and the sensor module form a shearing interferometer or point diffraction interferometer, known to a person skilled in the art, and serve to measure wavefront errors of the projection lens 16. To this end, phase shifting methods, which are known to a person skilled in the art, are applied in particular.

The evaluation device 32 establishes the state characterization 34 of the projection lens 16 from the intensity patterns recorded by the detector 30. In accordance with the present embodiment, the state characterization 34 includes a set of Zernike coefficients $b_j$ characterizing the wavefront errors of the projection lens 16.

In the present application, the Zernike functions $Z_m^n$, as known from e.g. Chapter 13.2.3 in the textbook "Optical Shop Testing", $2^{nd}$ Edition (1992) by Daniel Malacara, pub. John Wiley & Sons, Inc., are denoted by $Z_j$ in accordance with the so-called fringe sorting, as described in e.g. paragraphs [0125]-[0129] in US 2013/0188246A1, with $b_j$ then being the Zernike coefficients assigned to the respective Zernike polynomials (also referred to as "Zernike functions"). The fringe sorting is visualized, for example, in Table 20-2 on page 215 of the "Handbook of Optical Systems", Vol. 2 by H. Gross, 2005 Wiley-VCH Verlag GmbH & Co. KGaA, Weinheim. The wavefront deviation $W(\rho,\Phi)$ at a point in the object plane of the projection lens is then developed as follows in a manner dependent on the polar coordinates $(\rho,\Phi)$ of the pupil plane:

$$W(\rho, \Phi) = \sum_j b_j \cdot Z_j(\rho, \Phi) \qquad (1)$$

While the Zernike functions are denoted by $Z_j$, i.e. with the subscript index j, the Zernike coefficients are denoted by $b_j$ within the scope of this application. It should be noted here that the Zernike coefficients $b_j$ are often also denoted by Zj, i.e. with a normally written index, in the specialist world, such as e.g. Z5 and Z6 representing astigmatism.

The state characterization 34 established by the evaluation device 32 of the measurement system 12 is transferred to the control device 14, which generates the travel command 38 therefrom. The travel command 38 includes travels $x_i$ and travels $x_n^L$. These travels $x_i$ serve to control manipulators $M_s$ of the projection lens 16, while the travels $x_n^L$ serve to control a post-processing device 36 for mechanical post-processing of optical elements of the projection lens 16. Within the scope of this application, both the manipulators $M_s$ and the post-processing device 36 are understood to be manipulators of the projection lens 16 in the general sense.

The projection lens 16 only has four optical elements L1 to L4 in the embodiment in accordance with FIG. 1. All optical elements are mounted in a movable manner. To this end, a respective manipulator $M_s$, namely respectively one of the manipulators M1 to M4, is assigned to each one of the optical elements L1 to L4. The manipulators M1, M2 and M3 each enable a displacement of the assigned optical elements L1, L2 and L3 in the x- and y-direction and therefore substantially parallel to the plane in which the respective reflecting surface of the optical elements lies.

The manipulator M4 is configured to tilt the optical element L4 by rotation about a tilt axis 40 arranged parallel to the y-axis. As a result, the angle of the reflecting surface of L4 is changed in relation to the incident radiation. Further degrees of freedom for the manipulators are conceivable. Thus, for example, provision can be made for a displacement of the relevant optical element transversely to the optical surface thereof or for a rotation about a reference axis perpendicular to the reflecting surface.

In general terms, each one of the manipulators M1 to M4 illustrated here is provided to bring about a displacement of the assigned optical element L1 to L4 while performing a rigid body movement along a predetermined travel. By way of example, such a travel can combine translations in different directions, tilts and/or rotations in any manner. Alternatively or additionally, it is also possible to provide manipulators which are configured to undertake a different mannered change of a state variable of the assigned optical element by an appropriate actuation of the manipulator. In this respect, an actuation can be carried out by e.g. applying a specific temperature distribution or specific force distribution to the optical element. In this case, the travel can be as a result of a change in the temperature distribution of the optical element or the application of local tension to an optical element embodied as a deformable lens or as a deformable mirror.

In the shown case, the travels $x_i$ included by the travel command 38 contain the travels $x_1$, $x_2$, $x_3$ and $x_4$, which specify changes to be carried out by the manipulators M1 to M4 and which therefore serve to control the manipulators M1 to M4 of the projection lens 16. The established travels $x_1$ to $x_4$ are transferred to the individual manipulators M1 to M4 by way of travel signals and they provide the manipulators with respective correction travels to be carried out. These define corresponding displacements of the assigned optical elements L1 to L4 for correcting wavefront errors of the projection lens 16 that occurred. In the case where a manipulator has a plurality of degrees of freedom, it is also possible to transfer a plurality of travels $x_i$ thereto.

The travels $x_n^L$ furthermore included by the travel command 38 contain the travels $x_n^1$, $x_n^2$, $x_n^3$ and $x_n^4$ in the shown case, which travels serve to control the post-processing device 36 for the respective mechanical post-processing of the optical elements L1, L2, L3 and L4 of the projection lens 16. Therefore, like the travels $x_1$ to $x_4$, the travels $x_n^1$ to $x_n^4$ serve to correct wavefront errors of the projection lens 16 that occurred. The post-processing device 36 should be understood to mean a device for mechanical ablation of material at an optical surface of an optical element in the form of a lens or mirror. This ablation is subsequent to the production of the optical element and it serves, in particular, to change a spherical surface into an aspherical surface. Therefore, a correspondingly post-processed optical element is referred to as an intrinsically corrected asphere (ICA). In particular, an ablation device usually used for the mechanical processing of ICAs can be used as a post-processing device 36. Therefore, the ablations are also referred to as "ICA ablations" below. By way of example, an ion beam can be used for mechanical processing. Using this, it is possible to work any correction profile into a post-processed optical element.

The functionality of the control device 14 is illustrated below in an exemplary manner. It is configured to carry out a travel-generating optimization algorithm. The optimization algorithm serves to optimize a merit function H, which is also referred to as figure-of-merit function.

Below, the travels of the travel command 38 which is to be generated by the optimization algorithm are described using one travel variable, the travel variable including a travel vector x and a further travel vector $x^L$. The vector components of the travel vector x are the aforementioned individual travels $x_i$ of the manipulators provided in the projection lens 16. The vector components of the travel vector $x^L$ are the travels serving to control the ICA post-processing device 36 and $x_n^L$. The travels $x_i$ and $x_n^L$ are also referred to as travel variables. The state characterization 34 is described by a state vector b, the vector components of which are the aforementioned Zernike coefficients $b_j$. The Zernike coefficients $b_j$ are also referred to as state parameters. The sensitivities of the manipulators, in the present case the manipulators M1 to M4, in relation to the degrees of freedom thereof in the case of a state change are described via a sensitivity matrix M in accordance with one embodiment variant. Here, the sensitivity matrix M describes the relationship between an adjustment of a degree of freedom i of a manipulator by a standard travel $x_i^0$ and a change, resulting therefrom, of the state vector b of the projection lens 16.

In accordance with one embodiment, the travel-generating optimization algorithm according to the disclosure is configured to solve the following optimization problem:

$$\min(H) \tag{2}$$

Further details in respect of the basic solution of such an optimization problem can be gathered from, for example, WO2010/034674A1, in particular from pages 38 to 45.

In accordance with one embodiment, the merit function H is composed as follows from a plurality of merit function components:

$$H = H_b + H_f + H_{ovl} + H_x + H_{ica} + H_{rms} \tag{3}$$

Here, the component $H_b$ contains the weighted individual Zernike coefficients $b_j$. $H_f$ contains specifications in respect of so-called fading aberrations. A fading aberration is understood to mean a specification as to how an image aberration changes in the scanning direction of a projection exposure apparatus, i.e. in the direction of the relative movement between the mask and the wafer during the exposure. $H_{ovl}$ contains specifications in respect of so-called overlay errors. An overlay error specifies a local image position displacement of an imaged mask structure in relation to the setpoint position thereof on the substrate. $H_x$ describes the boundary conditions of the manipulators $M_s$. $H_{ica}$ describes boundary conditions of the ICA ablations to be carried out via the post-processing device 36. Since the boundary conditions described via $H_x$ and via $H_{ica}$ are described within the scope of the merit function H, these are so-called implicit constraints. $H_{rms}$ contains grouped RMS values of the Zernike coefficients $b_j$. As a person skilled in the art knows, an RMS value of coefficients should be understood to mean the square root of the sum of the squares of the coefficients.

An exemplary embodiment for the merit function component $H_b$ is described below. The condition for the individual Zernike coefficients $b_j$ is:

$$|(Mx-b)_j| \leq S_j^b \tag{4}$$

Here, $S_j^b$ is the target value or the predetermined specification for the Zernike coefficients $b_j$. M is the sensitivity matrix, already described above, and x is the travel vector relating to the manipulators $M_s$. The merit function component $H_b$ describing the contribution of the Zernike coefficients $b_j$ in the merit function H is as follows:

$$H_b = \sum_j \left( \frac{(Mx-b)_j}{t_j^b * S_j^b} \right)^{2n_j^b} \quad (5)$$

Here, $t_j^b$ and $n_j^b$ denote parameters that are freely selectable by the user. The respective target value $S_j^b$ for the corresponding Zernike coefficient is a so-called "hard" target value in accordance with one exemplary embodiment. This is taken into account when selecting the respective parameter $t_j^b$ by virtue of a value in the range from 0.6 to 0.95 being assigned to the parameter $t_j^b$. The parameter $t_j^b$ is also denoted a weighting factor for the target value $S_j^b$. A "hard target value" should be understood to mean a target value which may only be slightly overshot or undershot.

If the substitutions $\delta b_j = (Mx-b)_j$ and $sb_j = t_j^b * S_j^b$ are carried out, $H_b$ can be expressed as follows:

$$H_b = \sum_j \left( \frac{\delta b_j}{sb_j} \right)^{2n_j^b} \quad (5')$$

Hence, $H_b$ is a linear combination of the exponential expressions $$\left( \frac{\delta b_j}{sb_j} \right)^{2n_j^b}.$$

The base $$\left( \frac{\delta b_j}{sb_j} \right)$$

of the exponential expressions contains a function of the travel vector x and hence of the travel variable $x_i$. The aforementioned freely selectable parameters $n_j^b$ are the associated exponents of the aforementioned exponential expressions. Since the target value $S_j^b$ is a "hard" target value in the present exemplary embodiment, a value greater than 10, in particular greater than 18 is assigned to the respective exponent $n_j^b$. In accordance with one exemplary embodiment, the value assigned to the respective exponent $n_j^b$ is in the range from 10 to 30 in each case.

The diagram depicted in FIG. 3 shows the merit function component $H_b$ as a function of the base $$\left( \frac{\delta b_j}{sb_j} \right).$$

What is possible to read off from the diagram is that, as a result of the selection of the exponent $n_j^b$, the function becomes very steep when $\delta b_j$ is close to the weighted target value $sb_j$ in respect of magnitude. Although outliers in the Zernike coefficients $b_j$, i.e. values of $b_j$ above or below the target value, are admitted, they are weighted so strongly that they hardly appear in practical terms.

An exemplary embodiment for the merit function component $H_f$ is described below. The so-called fading aberrations $b_j^f$ can be calculated from the measured Zernike aberrations $b_j$. The condition for the fading aberrations $b_j^f$ is as follows:

$$\delta f_j \leq S_j^f \quad (6)$$

wherein $$\delta f_j = \sqrt{\sum_m w_m (M_f^j x - b_f^j)_m^2} \quad (7)$$

Here, $S_j^f$ is the target value or the predetermined specification for the fading aberration $b_j^f$. The sum m runs over all field points along the scanning direction of the projection exposure apparatus. The parameter $w_m$ denotes so-called scan weightings, i.e. weightings of the image aberrations which can be traced back to the scanning movement. $M_f^j$ denotes a sensitivity matrix for the fading aberrations $b_j^f$ and therefore defines the change in the state vector b of the projection lens due to fading aberrations when adjusting the manipulators $M_s$ by one standard travel $x_0$.

The merit function component $H_f$ describing the contribution of the fading aberrations in the merit function H is as follows:

$$H_f = \sum_j \left( \frac{\delta f_j}{t_j^f S_j^f} \right)^{2n_j^f} \quad (8)$$

Here, $t_j^f$ and $n_j^f$ denote parameters that are freely selectable by the user. The respective target value $S_j^f$ for the corresponding fading aberration is a so-called "hard" target value in accordance with one exemplary embodiment. This is taken into account when selecting the respective parameter $t_j^f$ by virtue of a value in the range from 0.6 to 0.95 being assigned to the parameter $t_j^f$. The parameter $t_j^f$ is also denoted a weighting factor for the target value $S_j^f$.

Hence, $H_b$ is a linear combination of the exponential expressions $$\left( \frac{\delta f_j}{t_j^f S_j^f} \right)^{2n_j^f}.$$

The base $$\left( \frac{\delta f_j}{t_j^f S_j^f} \right)$$

of the exponential expressions contains a function of the travel vector x and hence of the travel variable $x_i$. The aforementioned freely selectable parameters $n_j^f$ are the associated exponents of the aforementioned exponential expressions. Since the target value $S_j^f$ is a "hard" target value in the present exemplary embodiment, a value greater than 10, in particular greater than 18 is assigned to the respective exponent $n_j^f$. In accordance with one exemplary embodiment, the value assigned to the respective exponent $n_j^f$ is in the range from 10 to 30 in each case.

The profile of the merit function component $H_f$ as a function of the base $$\left(\frac{\delta f_j}{t_j^f S_j^f}\right)$$

corresponds substantially to the profile of the merit function component $H_b$ depicted in FIG. 3. The explanations made above in respect of the profile of the diagram in accordance with FIG. 3 can therefore be transferred to the profile of $H_f$.

An exemplary embodiment for the merit function component $H_{ovl}$ is described below. Overlay errors are determined for different structure types, such as e.g. isolated lines, lines arranged in a grid, circular structures, etc. The different structure types are denoted by the index p. An overlay error as a function of the structure type p and the field point m is denoted by the product $(SZ^p b)_m$. Here, $SZ^p$ is a matrix which includes field point-dependent weightings for the individual Zernike coefficients $b_j$. An overlay error $(SZ^p b)_m$ is therefore formed by linear combinations of individual Zernike coefficients $b_j$.

The condition for the overlay errors $(SZ^p b)_m$ in the optimization algorithm is as follows:

$$OVL_p \leq S_p^{ovl}, \quad (9)$$

wherein $$OVL_p = \max_m((SZ^p Mx - SZ^p b)_m) \quad (10)$$

Here, $S_p^{ovl}$ is the target value or the predetermined specification for the overlay error of the structure type p. The matrix M is the sensitivity matrix already described above in relation to the merit function component $H_b$. The max function determines the maximum over all field points m.

The merit function component $H_{ovl}$ describing the contribution of the overlay errors in the merit function H is as follows:

$$H_{ovl} = \sum_m \sum_p \left(\frac{(SZ^p Mx - SZ^p b)_m}{t_p^{ovl} * S_p^{ovl}}\right)^{2n_p^{ovl}} \quad (11)$$

Here, $t_p^{ovl}$ and $n_p^{ovl}$ denote parameters that are freely selectable by the user. The respective target value $S_p^{ovl}$ for the corresponding overlay error is a so-called "hard" target value in accordance with one exemplary embodiment. This is taken into account when selecting the respective parameter $t_p^{ovl}$ by virtue of a value in the range from 0.6 to 0.95 being assigned to the parameter $t_p^{ovl}$. The parameter $t_p^{ovl}$ is also denoted a weighting factor for the target value $S_p^{ovl}$.

Hence, $H_{ovl}$ is a linear combination of the exponential expressions $$\left(\frac{(SZ^p Mx - SZ^p b)_m}{t_p^{ovl} * S_p^{ovl}}\right)^{2n_p^{ovl}}.$$

The base $$\left(\frac{(SZ^p Mx - SZ^p b)_m}{t_p^{ovl} * S_p^{ovl}}\right)$$

of the exponential expressions contains a function of the travel vector x and hence of the travel variable $x_i$. The aforementioned freely selectable parameters $n_p^{ovl}$ are the associated exponents of the aforementioned exponential expressions. Since the target value $S_p^{ovl}$ is a "hard" target value in the present exemplary embodiment, a value greater than 10, in particular greater than 18 is assigned to the respective exponent $n_p^{ovl}$. In accordance with one exemplary embodiment, the value assigned to the respective exponent $n_p^{ovl}$ is in the range from 10 to 30 in each case.

The profile of the merit function component $H_{ovl}$ as a function of the base $$\left(\frac{(SZ^p Mx - SZ^p b)_m}{t_p^{ovl} * S_p^{ovl}}\right)$$

corresponds substantially to the profile of the merit function component $H_b$ depicted in FIG. 3. The explanations made above in respect of the profile of the diagram in accordance with FIG. 3 can therefore be transferred to the profile of $H_{ovl}$.

An exemplary embodiment for the merit function component $H_x$ is described below. The travels $x_i$ of the manipulators $M_s$ have lower limits $x_i^{min}$ and upper limits $x_i^{max}$, and so the following applies:

$$x_i^{min} \leq x_i \leq x_i^{max} \quad (12)$$

As already explained above, an individual $x_i$ denotes one degree of freedom of a manipulator $M_s$, wherein the individual manipulators may have one or more degrees of freedom. If the following substitutions are used:

$$y_i = (m_i x_i + c_i) \quad (13)$$

$$m_i = \frac{2}{x_i^{max} - x_i^{min}} \quad (14)$$

$$c_i = \frac{x_i^{max} + x_i^{min}}{x_i^{min} - x_i^{max}}, \quad (15)$$

equation (12) can be expressed in the following form:

$$-1 \leq y_i \leq 1 \quad (16)$$

The merit function component $H_x$ relating to the limits of the manipulators is then expressed as:

$$H_x = \sum_{i=1}^{DOF} \left(\frac{y_i}{t_i^y}\right)^{2n_i^y} \quad (17)$$

Here, the sum of the index i runs over all degrees of freedom of all manipulators $M_s$. The parameters freely selectable by the user are $t_i^y$ and $n_i^y$. The limits $x_i^{min}$ and $x_i^{max}$ are so-called "hard" target values. This is taken into account when selecting the corresponding parameter $t_i^y$ by virtue of a value in the range from 0.6 to 0.95 being assigned to the parameter $t_i^y$.

Hence, $H_x$ is a linear combination of the exponential expressions $$\left(\frac{y_i}{t_i^y}\right)^{2n_i^y}.$$

The parameter $y_i$ and hence the base $$\left(\frac{y_i}{t_i^y}\right)$$

of the exponential expressions contains a function of the travel vector x and hence of the travel variable $x_i$. The aforementioned freely selectable parameters $n_i^y$ are the associated exponents of the aforementioned exponential expressions. Since the limits $x_i^{min}$ and $x_i^{max}$ are "hard" target values in the present exemplary embodiment, a value greater than 10, in particular greater than 18 is assigned to the respective exponent $n_i^y$. In accordance with one exemplary embodiment, the value assigned to the respective exponent $n_i^y$ lies in the range from 10 to 30 in each case.

The profile of the merit function component $H_x$ as a function of the base $$\left(\frac{y_i}{t_i^y}\right)$$

corresponds substantially to the profile of the merit function component $H_b$ depicted in FIG. 3. The explanations made above in respect of the profile of the diagram in accordance with FIG. 3 can therefore be transferred to the profile of $H_x$.

An exemplary embodiment for the merit function component $H_{ica}$ is described below. As already mentioned above, $H_{ica}$ describes boundary conditions of the ICA ablations to be undertaken via the post-processing device 36 on individual optical elements, such as the optical elements L1 to L4 of the projection lens 16 in accordance with FIG. 1. The profiles $F_L(x^K,y^K)$ generated in an optical element via ICA ablations can be described as follows as a sum of n base functions $f_n^L(x^K,y^K)$:

$$F_L(x^K, y^K) = \sum_o f_o^L(x^K, y^K) x_n^L \quad (18)$$

Here, $x^K$ and $y^K$ denote the Cartesian x- and y-coordinates on a relevant optical element L. In accordance with one exemplary embodiment, the base functions $f_o^L(x^K,y^K)$ are calculated from the measured Zernike coefficients $b_j$ of the projection lens 16 using a conversion matrix containing the sensitivities for ICA ablations. In this case, the base functions $f_o^L(x^K,y^K)$ contain a sum of Zernike polynomials. Alternatively, the base functions $f_o^L(x^K,y^K)$ can also be built up from spline functions, Legendre polynomials, etc.

A peak-to-valley function $PV_L$ of the ICA ablations is defined as follows:

$$PV_L = \max_{x^K, y^K} F_L(x^K, y^K) - \min_{x^K, y^K} F_L(x^K, y^K) \quad (19)$$

The limit condition for the resulting profile $F_L(x^K,y^K)$ is as follows:

$$PV_L \leq S_L^{pv} \quad (20)$$

Here, the target value $S_L^{pv}$ is a value which is determined by the ion beam production process. Equation (20) ensures that variations in the profile cannot become arbitrarily large. In accordance with the described exemplary embodiment, the corresponding target value $S_L^{pv}$ is a so-called "soft" target value, which need not be observed as precisely as a "hard" target value.

The merit function component $H_{ica}$ relating to the limits of ICA ablations is as follows:

$$H_{ica} = \sum_L \sum_n \left(\frac{2 f_n^L(x^K, y^K) x_n^L}{t_L^{pv} * S_L^{pv}}\right)^{2n_L^{pv}} \quad (21)$$

The sum of the index L runs over all optical elements in the case of which ICA ablations are undertaken and the sum over k runs over all base functions used to describe the relevant optical element.

Furthermore, $t_L^{pv}$ and $n_L^{pv}$ denote parameters that are freely selectable by the user. Since the target value $S_L^{pv}$ for the corresponding profile of the ICA ablation is a "soft" target value, a value in the range from 0.5 to 2.0 is assigned to the parameter $t_L^{pv}$. The parameter $t_L^{pv}$ is also denoted a weighting factor for the target value $S_L^{pv}$.

Hence, $H_{ica}$ is a linear combination of the exponential expressions $$\left(\frac{2 f_n^L(x^K, y^K) x_n^L}{t_L^{pv} * S_L^{pv}}\right)^{2n_L^{pv}}.$$

The base $$\left(\frac{2 f_n^L(x^K, y^K) x_n^L}{t_L^{pv} * S_L^{pv}}\right)$$

of the exponential expressions contains a function of the above-described travel vector $x^L$ and hence of the travel variable $x_n^L$. The aforementioned freely selectable parameters $n_L^{pv}$ are the associated exponents of the aforementioned exponential expressions. Since the target value $S_L^{pv}$ is a "soft" target value in the present exemplary embodiment, a value from 3 to 10 is assigned to the exponent $n_L^{pv}$.

The profile of the merit function component $H_{ica}$ as a function of the base $$\left(\frac{2 f_n^L(x^K, y^K) x_n^L}{t_L^{pv} * S_L^{pv}}\right)$$

differs from the profile of the merit function component $H_b$, depicted in FIG. 3, substantially in that the approach to the vertical lines arranged at −1 and +1 is less steep and the lines are exceeded more strongly.

An exemplary embodiment for the merit function component $H_{rms}$ is described below. To this end, grouped RMS values $RMS^r$ are defined as follows:

$$RMS^r = \max_m \sqrt{\sum_j (\alpha_j^r (Mx - b)_{j,m}^2)} \quad (22)$$

Here, r is an index of the grouped RMS value $RMS^r$. By way of example, the grouping is carried out by classifying the corresponding Zernike coefficients $b_j$ into the categories "spherical aberrations", "coma", "astigmatism", etc. The sum over j is a sum over Zernike orders, $\alpha_j^r$ are the weightings of the individual Zernike contributions $b_j$ to the RMS value with the index r and the maximum is established over all field points m of the image field of the projection lens 16. In accordance with different embodiments, the grouped RMS values $RMS^r$ include all Zernike coefficients $Z_j$ with $j \leq 10$, with $j \leq 25$, to with $j \leq 49$, with $j \leq 64$ or with $j \leq 100$.

The conditions for the RMS values are as follows:

$$RMS^r \leq S_r^{rms} \tag{23}$$

Here, $S_r^{rms}$ is the target value or the predetermined specification for the RMS value with the index r. The merit function component $H_{rms}$ describing the contribution of the RMS values in the merit function H is as follows:

$$H_{rms} = \sum_r \sum_m \left( \sum_j \frac{\alpha_r^j (Mx-b)_{j,m}^2}{(t_r^{rms} S_r^{rms})^2} \right)^{n_r^{rms}} \tag{24}$$

Here, $t_r^{rms}$ and $n_r^{rms}$ denote parameters that are freely selectable by the user. The respective target value $S_r^{rms}$ for the corresponding RMS value is a so-called "hard" target value in accordance with one exemplary embodiment. This is taken into account when selecting the respective parameter $t_r^{rms}$ by virtue of a value in the range from 0.6 to 0.95 being assigned to the parameter $t_r^{rms}$. The parameter $t_r^{rms}$ is also denoted a weighting factor for the target value $S_r^{rms}$.

Hence, $H_{rms}$ is a linear combination of the exponential expressions $$\left( \sum_j \frac{\alpha_r^j (Mx-b)_{j,m}^2}{(t_r^{rms} S_r^{rms})^2} \right)^{n_r^{rms}}.$$

The base $$\left( \sum_j \frac{\alpha_r^j (Mx-b)_{j,m}^2}{(t_r^{rms} S_r^{rms})^2} \right)$$

of the exponential expressions contains a function of the travel vector x and hence of the travel variable $x_i$. The aforementioned freely selectable parameters $n_r^{rms}$ are the associated exponents of the aforementioned exponential expressions. Since the target value $S_r^{rms}$ is a "hard" target value in the present exemplary embodiment, a value greater than 20, in particular greater than 36 is assigned to the respective exponent $n_r^{rms}$. In accordance with one exemplary embodiment, the value assigned to the exponent $n_r^{rms}$ is in the range from 20 to 60.

The profile of the merit function component $H_{rms}$ as a function of the base $$\left( \sum_j \frac{\alpha_r^j (Mx-b)_{j,m}^2}{(t_r^{rms} S_r^{rms})^2} \right)$$

corresponds substantially to the profile of the merit function component $H_b$ depicted in FIG. 3. The explanations made above in respect of the profile of the diagram in accordance with FIG. 3 can therefore be transferred to the profile of $H_{rms}$.

The parameters $n_j^b$, $n_j^f$, $n_p^{ovl}$, $n_i^y$, $n_L^{pv}$ and $n_r^{rms}$ are selected in such a way that the exponents $2n_j^b$, $2n_j^f$, $2n_p^{ovl}$, $2n_i^y$, $2n_L^{pv}$ and $2n_r^{rms}$ emerging thus in the individual merit function components have at least two different values. In other words, there is at least one exponent, the value of which differs from that of the other exponents. In accordance with further exemplary embodiments, the aforementioned exponents have a multiplicity of different values; in particular, each one of the exponents has a different value. As a result, the weightings of the different optimization variables can be set individually in a targeted manner during the optimization and hence the optimization result can be adapted ideally to the boundary conditions present.

Figure 2:
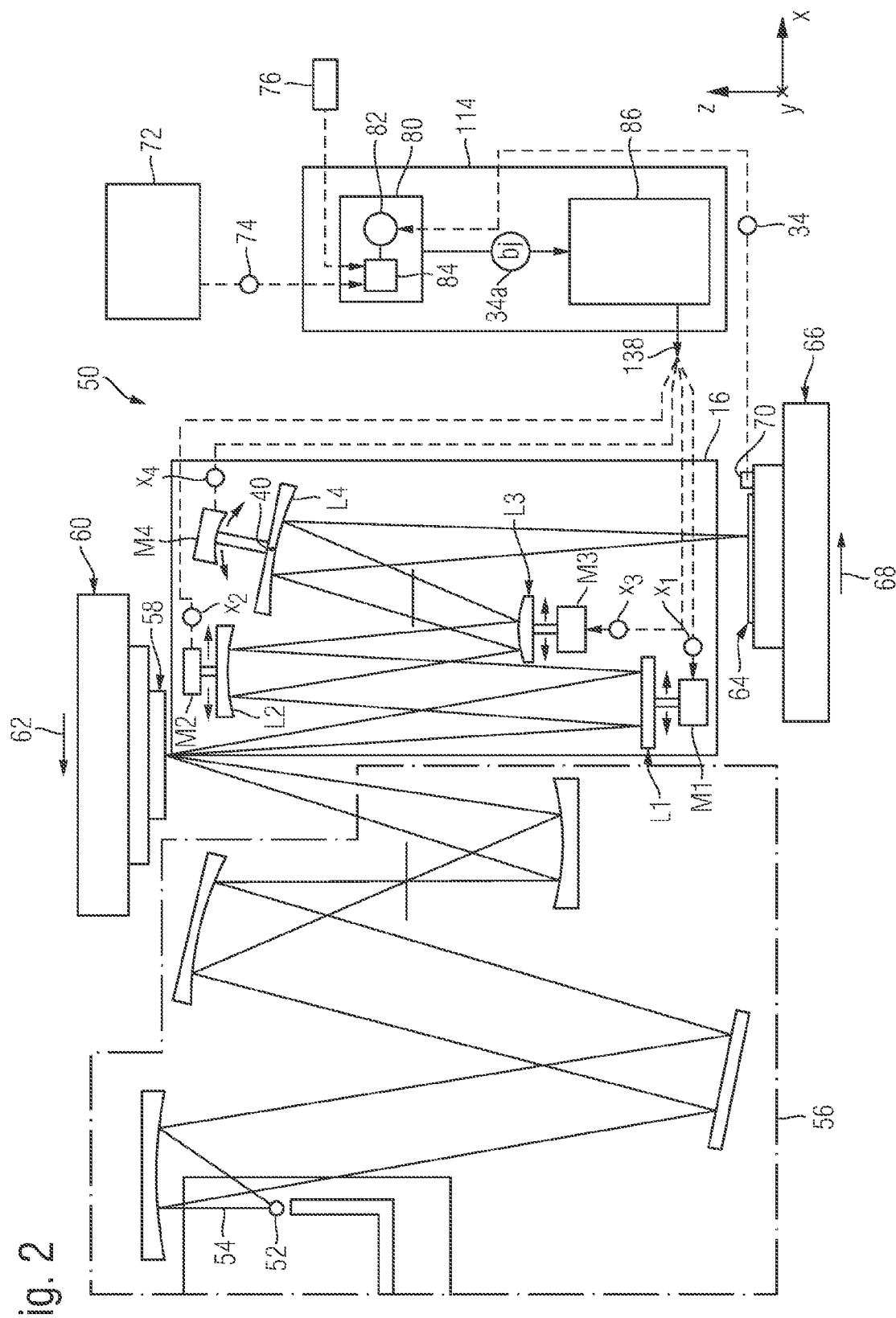
FIG. 2 shows a visualization of an embodiment of a microlithographic projection exposure apparatus according to the disclosure, including a projection lens and a control device for controlling manipulators of the projection lens.

FIG. 2 shows an embodiment according to the disclosure of a microlithographic projection exposure apparatus 50. The present embodiment is designed for operation in the EUV wavelength range. All optical elements are embodied as mirrors as a result of this operating wavelength. However, the disclosure is not restricted to projection exposure apparatuses in the EUV wavelength range. Further embodiments according to the disclosure are designed, for example, for operating wavelengths in the UV range, such as e.g. 365 nm, 248 nm or 193 mm. In this case, at least some of the optical elements are configured as conventional transmission lens elements.

The projection exposure apparatus 10 in accordance with FIG. 2 includes an exposure radiation source 52 for generating exposure radiation 54. In the present case, the exposure radiation source 52 is embodied as an EUV source and it can include, for example, a plasma radiation source. The exposure radiation 54 initially passes through an illumination optical unit 56 and it is guided onto a mask 58 thereby. The illumination optical unit 56 is configured to generate different angle distributions of the exposure radiation 54 incident on the mask 58. Depending on an illumination setting desired by the user, the illumination optical unit 56 configures the angle distribution of the exposure radiation 54 incident on the mask 58. Examples for selectable illumination settings include a so-called dipole illumination, annular illumination and quadrupole illumination.

The mask 58 has mask structures to be imaged on a substrate 64 in the form of a wafer and it is displaceably mounted on a mask displacement stage 60. As depicted in FIG. 2, the mask 58 can be embodied as a reflection mask or, alternatively, it can also be configured as a transmission mask, in particular for UV lithography. In the embodiment in accordance with FIG. 2, the exposure radiation 54 is reflected at the mask 58 and it thereupon passes through the projection lens 16, which was already described with reference to the adjustment apparatus 10 in accordance with FIG. 1. The projection lens serves to image the mask structures of the mask 58 on the substrate 64. The exposure radiation 54 is guided within the projection lens 16 via a multiplicity of optical elements, presently in the form of mirrors. The substrate 64 is displaceably mounted on a substrate displacement stage 66. The projection exposure apparatus 50 can be designed as a so-called scanner or a so-called stepper.

In the case of an embodiment is a scanner, which is also referred to as a step- and scan projection exposure apparatus, the mask displacement stage 60 and the substrate displacement stage 66 are moved in opposite directions during each instance of imaging the mask 58 on the substrate 64, i.e. each instance of exposing a field on the substrate 64. As shown in FIG. 2, in this case, for example, the mask displacement stage 60 moves in a scanning direction 62 pointing to the left and the substrate displacement stage moves in a scanning direction 68 pointing to the right. The fading aberrations, described above in the context of the description of the merit function component $H_f$, can be traced back to the scanning movements during the field exposure of such a scanner.

The projection exposure apparatus 50 furthermore includes a central controller 72 for controlling the exposure process, including the mask displacement stage 60 and the substrate displacement stage 66. The projection exposure apparatus 10 furthermore includes a control device 114 for controlling the manipulators M1 to M4. The control device 114, in turn, includes a state encoder 80 and a travel establishing device 86. The state encoder 80 transmits current state characterisations 34a of the projection lens 16 to the travel establishing device 86, which generates a travel command 138 therefrom. The travel command 138 includes travels $x_i$, in the shown case the travels $x_1$, $x_2$, $x_3$ and $x_4$.

These travels serve to control the manipulators M1 to M4, as described in more detail above in relation to the adjustment apparatus 10 in accordance with FIG. 1.

The travel command 138 generated by the travel establishing device 86 includes changes to be carried out by the manipulators M1 to M4 in the form of state variables of the optical elements L1 to L4 corresponding to travels $x_i$. The established travels $x_i$ are transferred to the individual manipulators M1 to M4 by way of travel signals and they provide the manipulators with respective correction travels to be carried out. These define corresponding displacements of the assigned optical elements L1 to L4 for correcting wavefront errors of the projection lens 16 that occurred. In order to establish the travels $x_i$, the travel establishing device 86 receives respectively updated state characterisations 34a in the form of Zernike coefficients $b_j$ characterizing the wavefront from the state encoder 80, in particular when the exposure process is carried out.

In accordance with one embodiment, the travel establishing device 86 generates travels $x_i$ which are updated a number of times during the exposure of the substrate 64. In accordance with one embodiment, the state encoder 80 has a memory 82 and a simulation device 84. State characterisations 34 in the form of aberration parameters, which were established at the projection lens 16 via a wavefront measurement, are stored in the memory 82. These measurement results can be gathered via an external wavefront measurement system, such as the measurement system 12 described with reference to FIG. 1. However, alternatively, the state characterisations 34 can also be measured by a wavefront measurement device 70 which is integrated into the substrate displacement stage 66. By way of example, such a measurement can take place regularly after each exposure of a wafer or in each case after exposing a complete set of wafers. Alternatively, it is also possible to undertake a simulation or a combination of a simulation and a reduced measurement instead of a measurement.

The measurement values of the state characterization 34 in the form of aberration parameters in the form of Zernike coefficients, stored in the memory 82, are adapted to the updated conditions during the exposure process in each case by way of the simulation device 84 where desired. In accordance with one embodiment variant, the central controller 72 regularly transfers the current irradiation intensity 74 to the simulation device 84. From this and on the basis of the respective illumination setting, the simulation device 84 calculates changes, caused by lens element heating, in the aberration parameters. Furthermore, the simulation device continuously obtains measurement values from a pressure sensor 76 monitoring the ambient pressure of the projection exposure apparatus 10. Effects of changes in the ambient pressure on the operation parameters are taken into account by the simulation device 84.

The control device 114 of the projection exposure apparatus 50 in accordance with FIG. 2 differs from the controller 14 of the adjustment apparatus 10 in accordance with FIG. 1 in that, by way of the state encoder 80, the control device 114 converts the state characterization 34 measured by a wavefront measurement device into a current state characterization 34a using the current illumination intensity 74. The function of the travel establishing device 86 of the control device 114 corresponds to the function of the controller 14, but with the constraint that the travel command 138 generated by the control device 114 only includes the travel vector x with the travels $x_i$ of the manipulators, but not the travel vector $x^L$ for controlling the ICA post-processing device 36.

The present description of exemplary embodiments is to be understood to be exemplary. The disclosure effected thereby firstly enables the person skilled in the art to understand the present disclosure and the advantages associated therewith, and secondly encompasses alterations and modifications of the described structures and methods that are also obvious in the understanding of the person skilled in the art. Therefore, all such alterations and modifications, in so far as they fall within the scope of the disclosure in accordance with the definition in the accompanying claims, and equivalents are intended to be covered by the protection of the claims.

LIST OF REFERENCE SIGNS

10 Adjustment apparatus
12 Measurement system
14 Control device
16 Projection lens
18 Illumination device
20 Measurement radiation
22 Measurement mask
24 Object plane
26 Sensor element
28 Image plane
30 Detector
32 Evaluation device
34 State characterization
34a Current state characterization
36 Post-processing device
38 Travel command
40 Tilt axis
50 Projection exposure apparatus
52 Exposure radiation source
54 Exposure radiation
56 Illumination optical unit
58 Mask
60 Mask displacement stage
62 Scanning direction of the mask displacement stage
64 Substrate
66 Substrate displacement stage
68 Scanning direction of the substrate displacement stage
70 Wavefront measurement device
72 Central controller
74 Current radiation intensity
76 Pressure sensor
80 State encoder 82 Memory
84 Simulation device
86 Travel establishing device
114 Control device
138 Travel command
L1-L4 Optical elements
M1-M4 Manipulators
b State vector
$x_i$ Travels for manipulators
$x_n^L$ Travels for the ICA post-processing device The claims of the disclosure follow below.

What is claimed is:

1. A control device, wherein:
the control device is configured to control a manipulator of a microlithographic projection lens by generating a travel command;
the travel command defines a change to be undertaken of an optical effect of an optical element of the microlithographic projection lens by manipulating a property of the optical element via the manipulator along a travel;
the control device is configured to generate the travel command for the manipulator from a state characterization of the microlithographic projection lens by optimizing a merit function;
the merit function comprises a linear combination of at least two exponential expressions;
a setting of the manipulator defines the manipulation of the property of the optical element is represented via a travel variable and a respective base of the at least two exponential expressions contains a function of the travel variable; and
exponents of the at least two exponential expressions have different values.

2. The control device of claim 1, wherein the at least two exponential expressions have different bases.

3. The control device of claim 1, wherein each of the exponents of the at least two exponential expressions has a value of at least two.

4. The control device of claim 1, wherein, for each base of the at least two exponential expressions:
the base comprises a quotient comprising a numerator and a denominator;
the numerator of the base comprises a term comprising the function of the travel variable; and
the denominator of the base comprises a target value for the term of the numerator and a weighting factor for the target value.

5. The control device of claim 1, wherein a difference in the values of the at least two exponents is at least five.

6. The control device of claim 1, wherein:
the control device is configured to control a plurality of manipulators;
the state characterization comprises a plurality of state parameters characterized by a state vector; and
each of the exponential expressions comprises a sensitivity matrix defining a relationship between the travels of the manipulators and the state vector.

7. The control device of claim 1, wherein one of the exponential expressions comprises a term which describes an image aberration of the microlithographic projection lens.

8. The control device of claim 1, wherein one of the exponential expression comprises a term which describes a fading aberration of a microlithographic step-and-scan projection exposure apparatus.

9. The control device of claim 1, wherein one of the exponential expression comprises a term which describes a root mean square of a selection of image aberrations of the microlithographic projection lens.

10. The control device of claim 1, wherein one of the exponential expression comprises a term which describes a pure overlay error.

11. The control device of claim 1, wherein one of the exponential expressions includes a term which describes an error correctable by means of mechanical post-processing of an optical element of the microlithographic projection lens.

12. The control device of claim 1, wherein the merit function contains at least one implicit constraint for the travel.

13. An adjustment apparatus, the adjustment apparatus comprising:
a measurement system; and
a control device according to claim 1,
wherein:
the adjustment apparatus is configured to adjust the microlithographic projection lens; and
the measurement system is configured to establish the state characterization of the microlithographic projection lens.

14. The adjustment apparatus of claim 13, wherein the measurement system comprises a wavefront measurement device.

15. An apparatus, comprising:
a control device according to claim 1; and
the microlithographic projection lens.

16. The apparatus of claim 15, further comprising an illumination device configured to provide radiation to the microlithographic projection lens.

17. The apparatus of claim 15, further comprising a measurement system configured establish the state characterization of the microlithographic projection lens.

18. An apparatus, comprising:
an illumination optical unit configured to illuminate an object plane;
a projection lens configured to image the object plane into an image plane; and
a control device,
wherein:
the projection lens comprises an optical element and a manipulator;
the control device is configured to control the manipulator by generating a travel command;
the travel command defines a change to be undertaken of an optical effect of the optical element by manipulating a property of the optical element via the manipulator along a travel;
the control device is configured to generate the travel command for the manipulator from a state characterization of the projection lens by optimizing a merit function;
the merit function comprises a linear combination of at least two exponential expressions;
a setting of the manipulator defining the manipulation of the property of the optical element is represented via a travel variable and a respective base of the at least two exponential expressions contains a function of the travel variable; and
exponents of the at least two exponential expressions have different values.

19. The apparatus of claim 18, further comprising a measurement system configured establish the state characterization of the microlithographic projection lens.

20. A method of controlling a manipulator of a microlithographic projection lens, the method comprising:

generating a travel command for the manipulator by carrying out an optimization of a merit function, wherein:
  the merit function comprises a linear combination of at least two exponential expressions;
  a setting of the manipulator defines a manipulation of a property of an optical element of the microlithographic projection lens is represented via a travel variable, and a respective base of the at least two exponential expressions contains a function of the travel variable; and
  exponents of the at least two exponential expressions have different values; and
manipulating the property of the optical element via the manipulator along the travel variable defined by the generated travel command to change an optical effect of the optical element of the microlithographic projection lens.

* * * * *

UNITED STATES PATENT AND TRADEMARK OFFICE
CERTIFICATE OF CORRECTION

PATENT NO. : 9,823,578 B2  
APPLICATION NO. : 15/081074  
DATED : November 21, 2017  
INVENTOR(S) : Stefan Rist Page 1 of 1

It is certified that error appears in the above-identified patent and that said Letters Patent is hereby corrected as shown below:

In the Specification

Column 12, Line 5, after "  ", insert -- , --.

Signed and Sealed this  
Twenty-second Day of May, 2018

Andrei Iancu  
*Director of the United States Patent and Trademark Office*